(12) United States Patent
Gealow et al.

(10) Patent No.: US 7,164,376 B2
(45) Date of Patent: Jan. 16, 2007

(54) DUAL-MODE DELTA-SIGMA ANALOG TO DIGITAL CONVERTER SYSTEM AND METHOD

(75) Inventors: Jeffrey Gealow, Andover, MA (US); Paul Ferguson, Jr., North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/271,440

(22) Filed: Nov. 10, 2005

(65) Prior Publication Data

US 2006/0119491 A1 Jun. 8, 2006

Related U.S. Application Data

(60) Provisional application No. 60/627,578, filed on Nov. 12, 2004.

(51) Int. Cl.
*H03M 3/00* (2006.01)
(52) U.S. Cl. ....................................... 341/143
(58) Field of Classification Search ................ 341/143
See application file for complete search history.

(56) References Cited

U.S. PATENT DOCUMENTS

| | | | | |
|---|---|---|---|---|
| 5,230,098 | A * | 7/1993 | Seki ......................... | 455/234.1 |
| 6,005,896 | A * | 12/1999 | Maruyama .................. | 375/295 |
| 6,087,969 | A * | 7/2000 | Stockstad et al. ........... | 341/143 |
| 6,362,762 | B1 * | 3/2002 | Jensen et al. ............... | 341/143 |
| 6,414,615 | B1 | 7/2002 | Cheng | |
| 6,556,159 | B1 | 4/2003 | Fei et al. | |
| 6,765,517 | B1 | 7/2004 | Ali | |
| 6,822,592 | B1 * | 11/2004 | Gandolfi et al. ............ | 341/143 |
| 6,839,012 | B1 * | 1/2005 | Kawamura .................. | 341/143 |
| 6,911,928 | B1 * | 6/2005 | Orsier et al. ................ | 341/143 |
| 6,943,715 | B1 * | 9/2005 | Radja et al. ................ | 341/143 |
| 6,977,546 | B1 * | 12/2005 | Stapleton ..................... | 330/10 |
| 2004/0036640 | A1 | 2/2004 | Kawamura | |

FOREIGN PATENT DOCUMENTS

EP 0954107 11/1999

OTHER PUBLICATIONS

Burger et al., "A 13.5-mW 185-Msample/s ΔΣ Modulator for UMTS/GSM Dual-Standard IF Reception" Journal of Solid State Circuits, vol. 36, No. 12, Dec. 2001, pp. 1868-1878.
Schimper et al., "A 3mW Continuous-Time ΣΔ-Modulator for EDGE/GSM with High Adjacent Channel Tolerance" Solid States Circuit Conference, 2004.pp. 183-186, no month.
Chaing et al., "Dual-Band Sigma-Delta Modulator for Wideband Receiver Applications" Transactions of Fundamentals Electronics, Communications and Computer Sciences, Engineering Sciences Society, Tokyo Japan, vol. E87-A, No. 2 Feb. 2004, pp. 311-323.

(Continued)

*Primary Examiner*—Peguy JeanPierre
(74) *Attorney, Agent, or Firm*—Gauthier & Connors LLP

(57) ABSTRACT

A dual-mode delta-sigma analog to digital converter system is disclosed that uses a feed forward modulator and includes a low frequency resonator circuit and a high frequency resonator circuit and includes a feed-forward path from the final integrator in the high-frequency resonator circuit to a summer. The digital converter system includes a selection unit for permitting the high frequency resonator circuit and the low frequency resonator circuit to be employed in a first mode of operation. The system also permits the high frequency resonator circuit and the feed-forward path from the final integrator in the high-frequency resonator circuit to the summer to be disabled in a second mode of operation.

10 Claims, 5 Drawing Sheets

OTHER PUBLICATIONS

Minnis et al., "A Highly Digitalized Multimode Receiver Architecture for 3G Mobiles" Transactions on Vehicular Technology, vol. 52, No. 3, May 2003 pp. 637-657.

Jantzi et al., "A bandpass Sigma Delta A/D converter for a digital AM receiver" Analog to Digital and Digital to Analog Conversion, 1991, International Conference on Swansea, UK 1991, pp. 75-80, no month.

Veldhoven, "A Triple-Mode Continuous-Time Sigmadelta Modulator with Switched-Capacitor Feedback DAC for a GSM-EDGE/CDMA2000/UMTS Reciever" Journal of Solid State Circuits, vol. 38, No. 12Dec. 2003, pp. 2069-2076.

Salo et al., "80 MHz bandpass delta-sigma modulator using switched-capacitator resonator structure" Electronics Letters, vol. 37, No. 14, Jul. 2001, pp. 877-878.

Burger et al., "A 3V, 208mW CMOS ΔΣ-Modulator for GSM Applications" Swiss Federal Institute of Technology, 1998 Symposium on VLSI Circuits Digest of Technical Pages, pp. 90-91, no month.

T. Burger & Q. Huang, "A 13.5-mW 185-Msample/s ΔΣ Modulator for UMTS/GSM Dual-Standard IF Reception," IEEE Journal of Solid-State Circuits, vol. 36, No. 12, Dec. 2001, pp. 1868-1878.

* cited by examiner

DUAL-MODE DELTA-SIGMA ANALOG TO DIGITAL CONVERTER SYSTEM AND METHOD

PRIORITY

This application claims priority to U.S. Provisional Patent Application Ser. No. 60/627,578 filed Nov. 12, 2004.

BACKGROUND OF THE INVENTION

This invention relates generally to analog to digital converters, and relates in particular to delta-sigma analog to digital converters.

Analog to digital converters are employed for converting analog signals to digital signals in a wide variety of applications, including instrumentation and communication such as modem and wireless communication. Conventional analog to digital converters generally include Nyquist rate converters and over-sampled converters. Nyquist rate converters typically are designed to provide a certain output rate and to provide a single conversion operation per output sample. Over-sampled converters typically over-sample a given analog input signal. One type of over-sampled converter is a delta-sigma converter, such as disclosed in U.S. Pat. No. 6,414,615.

Many communications systems, however, are designed to be able to handle communication operations in two or more operational modes (such as GSM, WCDMA and TD-SCDMA etc. for wireless communication system). It is typically desirable that the same hardware be able to be used for each of the desired operational modes. Analog to digital converters, however, are typically either designed to support one mode of operation only, requiring duplication of the analog to digital function in the hardware, or include duplicative hardware. For example, while TD-SCDMA and WCDMA are both air interfaces for third generation (3G) terminals, TD-SCDMA downlink requires 2.56 Msps (2.56 million samples per second) analog to digital conversion with relatively high signal to noise ratio, while WCDMA requires 7.68 Msps analog to digital conversion with relatively low signal to noise ratio.

The difference between the two standards relates, in part, to the bandwidth of the signal and the performance of the analog to digital converter. WCDMA (wideband code division multiple access) uses a signal that has an occupied bandwidth of 5 MHz RF or 2.5 MHz baseband. TD-SCDMA (time division-synchronous code division multiple access) has an occupied bandwidth of 1.6 MHz as RF signal or 800 kHz used as a baseband signal. To support WCDMA, therefore, one needs a converter with a higher speed. For TD-SCDMA one needs 8 to 10 bits performance. The tradeoff, therefore, is that WCDMA requires a faster converter with fewer bits, while TD-SCDMA permits a slower converter with more bits. The problem, therefore, is how to have a converter that can be configured in two ways and be reasonably efficient for both jobs. Although one solution is to design a fast converter that gives 8 to 10 bits performance, but this would be inefficient and more costly and require more silicon area.

Another conventional dual-mode modulator is disclosed by T. Burger and Q. Huang in *A 13.5-mW 185-Msample/s ΔΣ Modulator for UMTS/GSM Dual-Standard IF Reception*, IEEE Journal of Solid-State Circuits, vol. 36, No. 12 (December 2001). A system disclosed therein provides that a resonator is disabled by disabling a feedback path from a third integrator to a second integrator. All integrators and feed-forward paths, however, remain active, and applicants have found that when a high frequency resonator feedback path is disabled and all integrators and feed-forward paths remain active, a delta-sigma modulator may not be sufficiently stable.

There is a need, therefore, for an analog to digital converter system that is efficient and economical to manufacture, yet supports two modes of operation.

SUMMARY OF THE INVENTION

A dual-mode delta-sigma analog to digital converter system and method are disclosed that use a feed-forward modulator and include a low frequency resonator circuit and a high frequency resonator circuit and include a feed-forward path from the final integrator in the high-frequency resonator circuit to a summer. The digital converter system includes a selection unit for permitting the high frequency resonator circuit and the low frequency resonator circuit to be employed in a first mode of operation. The system also permits the high frequency resonator circuit and the feed-forward path from the final integrator in the high-frequency resonator circuit to the summer to be disabled in a second mode of operation.

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

The invention provides a single delta-sigma analog to digital architecture that may be configured to efficiently operate as a fourth-order analog to digital converter for WCDMA applications and may be configured to efficiently operate as a third-order analog to digital converter for TD-SCDMA applications.

Figure 1:
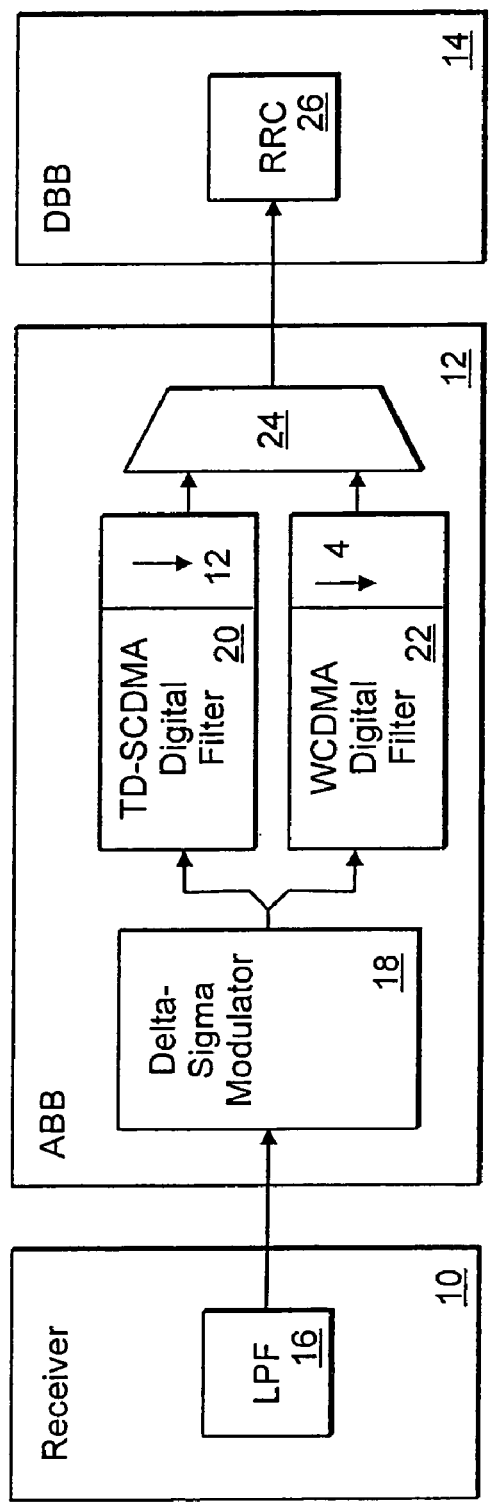
FIG. 1 shows an illustrative diagrammatic view of a receive path implementation of a dual-mode downlink path in a system in accordance with an embodiment of the invention.

As shown in FIG. 1, a communication system in which an analog to digital converter in accordance with an embodiment of the invention may be used includes a receiver unit 10, an analog baseband unit 12 and a digital baseband unit 14. The receiver unit 10 includes a low pass filter 16 that is coupled to a delta-sigma modulator unit 18 of the analog baseband unit 12. The analog baseband unit 12 also includes a TD-SCDMA digital filter and downsample by 12 unit 20 as well as a WCDMA digital filter and downsample by 4 unit 22 that are both coupled to the modulator 18 as well as a de-multiplexor 24. The de-multiplexor 24 of the analog baseband unit 12 is coupled to a receive path receiver 26 of the digital baseband unit 14.

During WCDMA operation, the system employs a frequency division duplex (FDD) method (at 3.84 MegaChips per second) whereby uplink and downlink transmission use two separate radio frequencies. In the FDD mode, each uplink and downlink uses the different frequency band. A pair of frequency bands that have a specified separation are assigned for the system. During TD-SCDMA operation, the system employs a time division duplex (TDD) method (at 1.28 MegaChips per second) whereby uplink and downlink transmissions are carried over the same radio frequency by using synchronized time intervals. In the TDD method, time slots in a physical channel are divided into transmission and reception portions. Information on uplink and downlink, therefore, are transmitted alternately.

Figure 2:
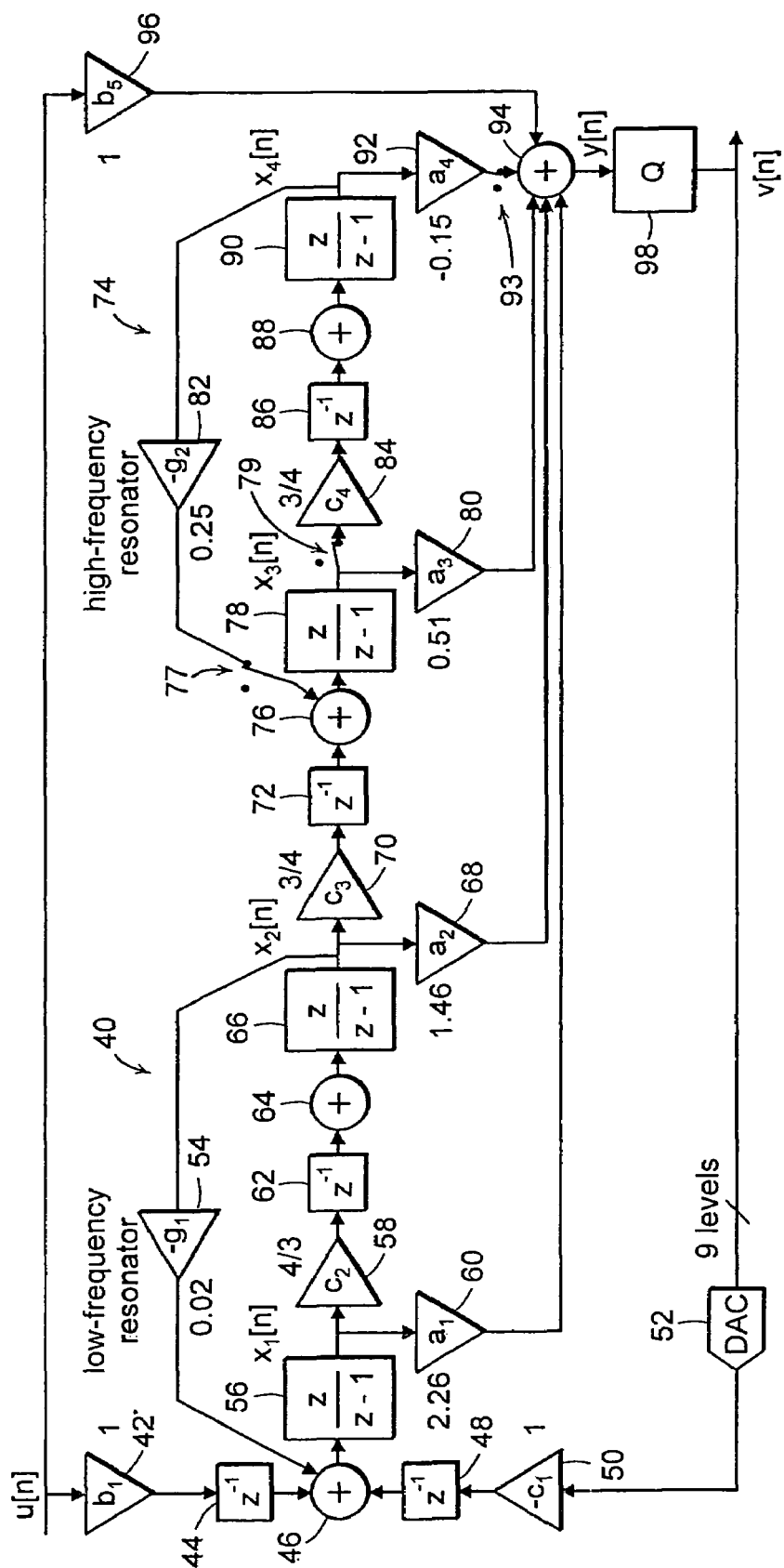
FIG. 2 shows an illustrative diagrammatic view of an analog to digital converter system in accordance with an embodiment of the invention as used in a first mode of operation.

As shown in FIG. 2, a system in accordance with an embodiment of the invention employs a feed forward architecture for a delta-sigma converter. In particular, the circuit includes a low-frequency resonator 40 and a high-frequency resonator 74. The low-frequency resonator 40 includes two integrator blocks ($z/(z-1)$) 56 and 66, a feedback signal path ($-g_1$) 54 and two feed-forward signal paths ($a_1$ and $a_2$) 60 and 68. The high frequency resonator 74 includes two integrator blocks ($z/(z-1)$) 78 and 90, a feedback signal path ($-g_2$) 82 and two feed-forward signal paths ($a_3$ and $a_4$) 80 and 92. The input is received at u[n] by signal paths 42 and 96 ($b_1$ and $b_5$ respectively). The first integrator 56 receives input from u[n], from output v[n] via a DAC 52, and from the low-frequency resonator feedback signal path ($-g_1$) 54. The second integrator 66 receives input from the first integrator 56 through signal path (c2) 58. The third integrator 78 receives input from the second integrator 66 through signal path (c3) 70 and receives input from the high-frequency resonator feedback signal path (g2) 82. The fourth integrator 90 receives input from the third integrator through signal path (c4) 84. The outputs of all four integrators are provided to a summer 94 through signal paths (a1) 60, a2 (68), a3 (80), and a4 (92). The output of the summer 94 is provided to a quantizer 98. The quantizer produces the output signal v[n].

Figure 3:
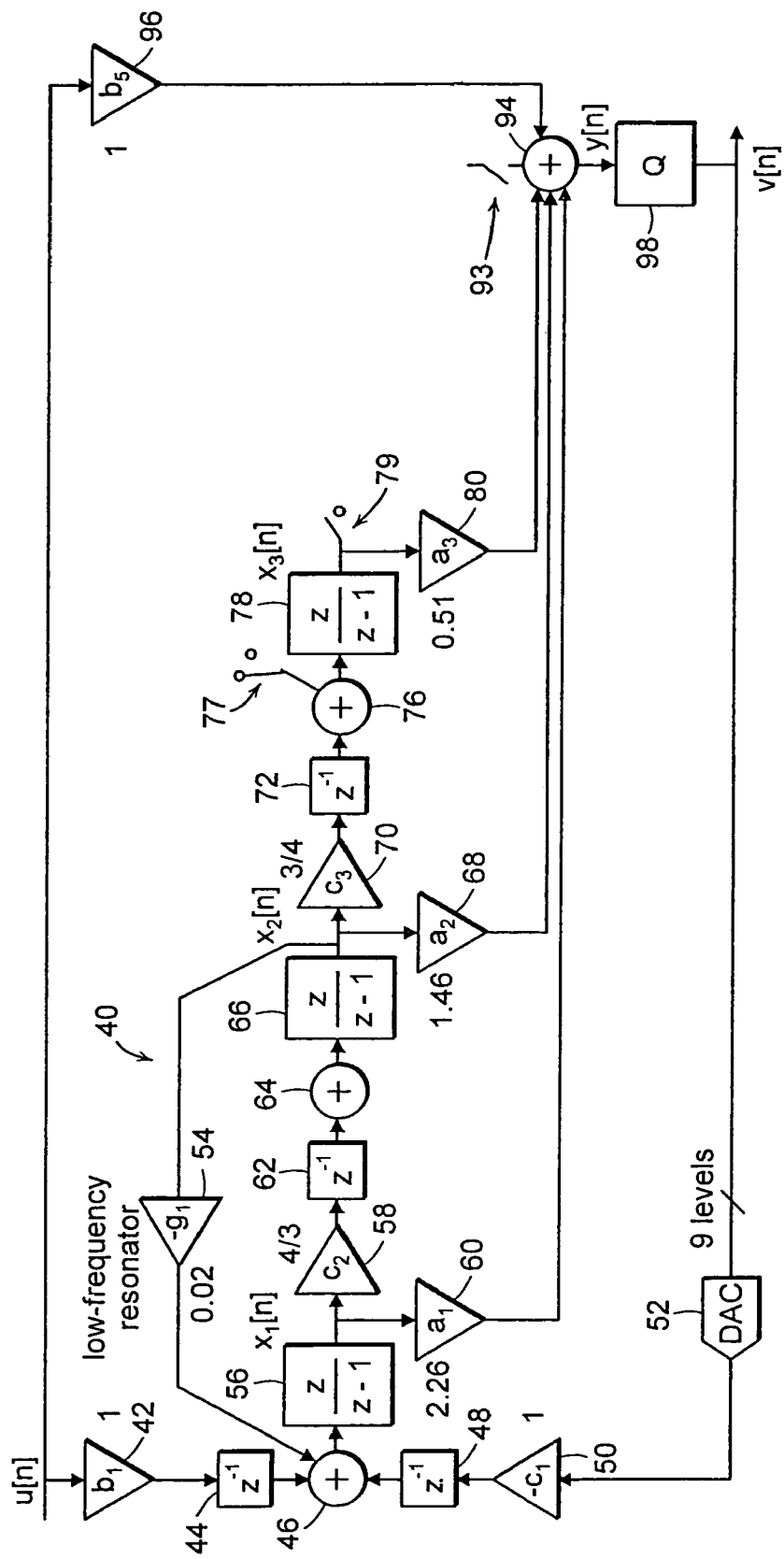
FIG. 3 shows an illustrative diagrammatic view of the analog to digital converter system of FIG. 2 as used in a second mode of operation.

When the switches 77, 79 and 93 are connected as shown in FIG. 2, the circuit operates in WCDMA mode. When the switches are opened, the circuit operates in TD-SCDMA mode as shown in FIG. 3. The circuit, therefore, includes four integrator blocks (z/z−1) and the output of each integrator goes to the next integrator. There is a direct path, therefore, from there to a summation block. This is one architecture for implementing delta-sigma converters. Into this architecture has been designed a path that supports wideband WCDMA and a path that permits one stage to be shut off to support TD-SCDMA. The two resonators in the WCDMA set the locations of the zeros in the transfer function. The implementation of those zeros has been chosen so that a low frequency resonator is provided that is common to both paths, and so that the high frequency resonator is used only in the WCDMA case and not in the TD-SCDMA case.

Figure 4B:
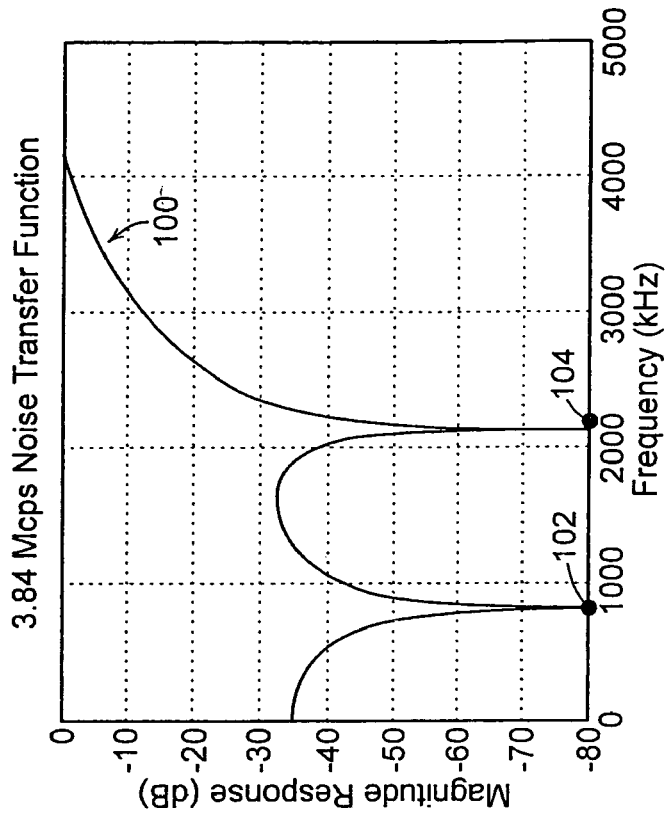
FIGS. 4A and 4B show illustrative diagrammatic views of the noise transfer function in a system in accordance with an embodiment of the invention in a first mode or operation.
Figure 4A:
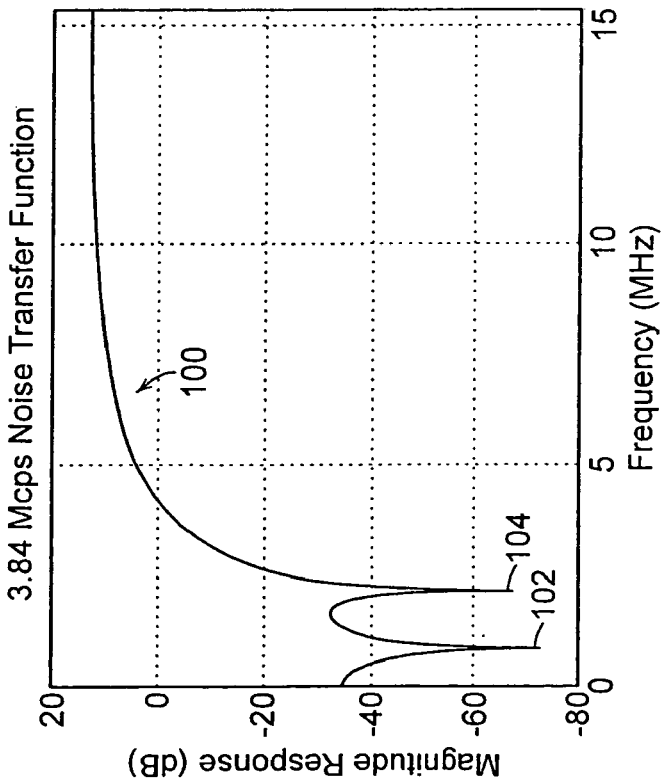
Figure 5B:
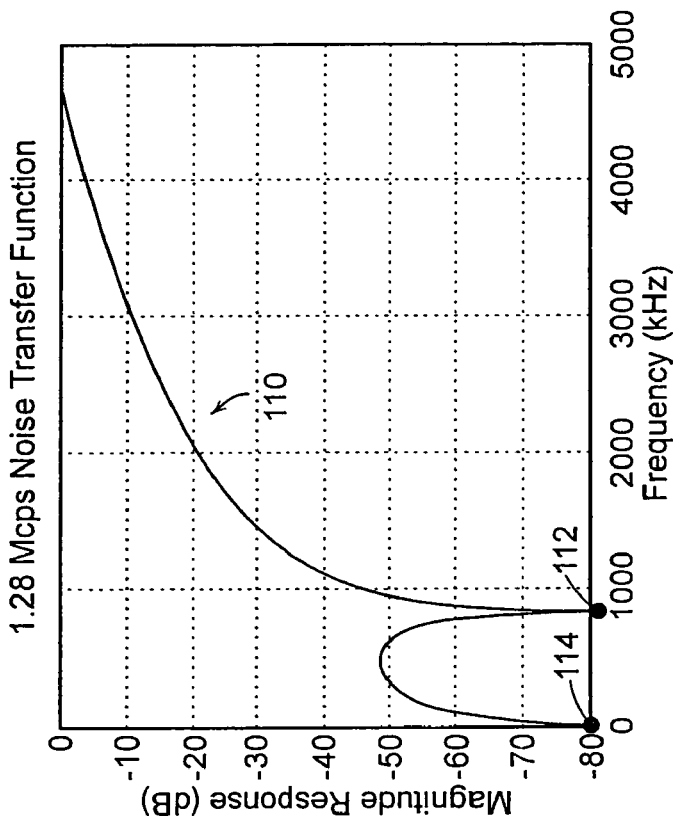
FIGS. 5A and 5B show illustrative diagrammatic views of the noise transfer function in a system in accordance with an embodiment of the invention in a second mode or operation.
Figure 5A:
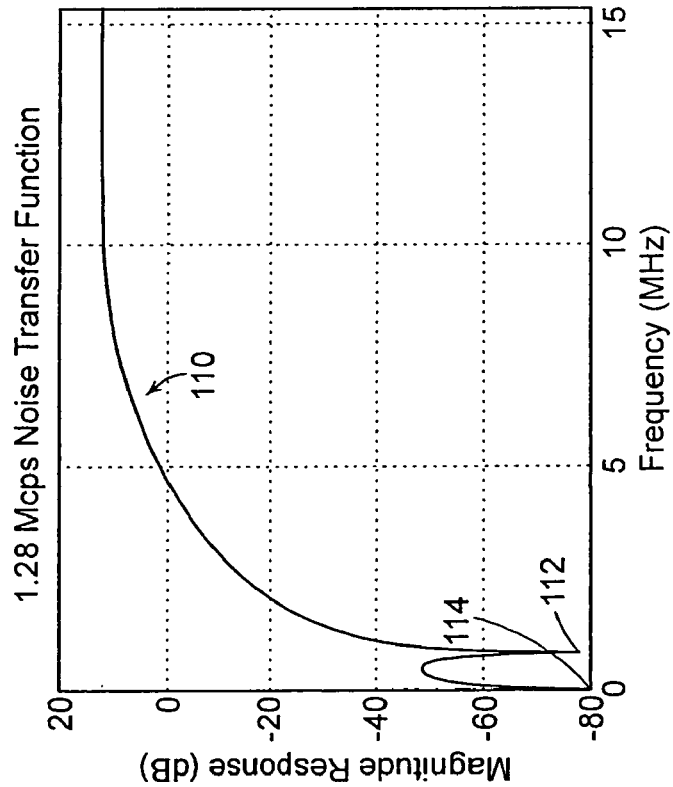

The noise transfer function is shown at 100 in FIGS. 4A and 4B in which zeros exist as indicated at 102 and 104. When the high frequency resonator and feed-forward path from the fourth integrator 90 to the summer 94 are de-coupled from the system, one zero is no longer in system since it becomes a third order system, and the other zero as shown at 112 in FIGS. 5A and 5B moves to 0 kHz and we retain the zero at 800 kHz as indicated at 114. For WCDMA we have a wider bandwidth of suppression in this transfer function. A stop-band also that extends about 2 MHz but we are getting about 35 dB of attenuation. This may be reconfigured to have a narrower bandwidth out to about 800 kHz but 50 dB of attenuation. This directly translates into higher accuracy for TD-SCDMA but with a lower bandwidth. This also provides lower accuracy but higher bandwidth for WCDMA. FIGS. 4A, 4B and 5A, 5B show the full transfer functions (100 and 110) out to one half the sampling rate, with FIGS. 4B and 5B showing enlarged portions of the transfer functions shown in FIGS. 4A and 5A.

The switching at switches 77, 79 and 93 may be implemented as switched capacitor inputs. To disable these, a signal may be multiplexed with a zero signal. The unused integrator may also be shut off to save power.

Those skilled in the art will appreciate that numerous modifications and variations may be made to the above disclosed embodiments without departing from the spirit and scope of the invention.

What is claimed is:

1. A dual-mode delta-sigma analog to digital converter system that uses a feed-forward modulator and includes a low-frequency resonator circuit and a high-frequency resonator circuit with a feed-forward path from the final integrator in the high-frequency resonator circuit to a summer, said digital converter system comprising selection means for permitting said high frequency resonator circuit and said low frequency resonator circuit to be employed in a first mode of operation, and for permitting said high frequency resonator circuit including said feed-forward path from the final integrator in the high-frequency resonator circuit to the summer to be disabled in a second mode of operation.

2. The converter system as claimed in claim 1, wherein said converter system includes a plurality of integrator units.

3. The converter system as claimed in claim 1, wherein said low frequency resonator circuit precedes said high frequency resonator circuit in the feed-forward architecture.

4. The converter system as claimed in claim 1, wherein said system provides a narrower bandwidth but greater quantization noise suppression in said second mode of operation.

5. The converter system as claimed in claim 1, wherein said first mode of operation is for WCDMA operation and said second mode of operation is for TD-SCDMA operation.

6. A method of providing dual-mode delta-sigma analog to digital conversion using a feed-forward modulator and a low-frequency resonator circuit and a high-frequency resonator circuit with a feed-forward path from the final integrator in the high-frequency resonator circuit to a summer, said method comprising the steps of permitting said high frequency resonator circuit and said low frequency resonator circuit to be employed in a first mode of operation, and permitting said high frequency resonator circuit including said feed-forward path from the final integrator in the high-frequency resonator circuit to the summer to be disabled in a second mode of operation.

7. The method as claimed in claim 6, wherein said high frequency resonator circuit includes a plurality of integrator units.

8. The method as claimed in claim 6, wherein said low frequency resonator circuit precedes said high frequency resonator circuit in the feed-forward architecture.

9. The method as claimed in claim 6, wherein said system provides a narrower bandwidth but greater quantization noise suppression in said second mode of operation.

10. The method as claimed in claim 6, wherein said first mode of operation is for WCDMA operation and said second mode of operation is for TD-SCDMA operation.

* * * * *